US010269751B2

(12) United States Patent
Chow et al.

(10) Patent No.: US 10,269,751 B2
(45) Date of Patent: Apr. 23, 2019

(54) LEADLESS PACKAGE WITH NON-COLLAPSIBLE BUMP

(71) Applicant: Nexperia B.V., Nijmegen (NL)

(72) Inventors: Wai Wong Chow, Kwai Chung (HK); On Lok Chau, Kwai Chung (HK)

(73) Assignee: Nexperia B.V., Nijmegen (NL)

( * ) Notice: Subject to any disclaimer, the term of this patent is extended or adjusted under 35 U.S.C. 154(b) by 83 days.

(21) Appl. No.: 15/343,172

(22) Filed: Nov. 3, 2016

(65) Prior Publication Data

US 2018/0122763 A1    May 3, 2018

(51) Int. Cl.
*H01L 23/00* (2006.01)
*H01L 23/31* (2006.01)

(52) U.S. Cl.
CPC .......... *H01L 24/14* (2013.01); *H01L 23/3114* (2013.01); *H01L 24/09* (2013.01); *H01L 24/13* (2013.01); *H01L 24/16* (2013.01); *H01L 24/81* (2013.01); *H01L 2224/10145* (2013.01); *H01L 2224/131* (2013.01); *H01L 2224/13011* (2013.01); *H01L 2224/13015* (2013.01); *H01L 2224/13017* (2013.01); *H01L 2224/13019* (2013.01); *H01L 2224/13023* (2013.01); *H01L 2224/141* (2013.01); *H01L 2224/14051* (2013.01); *H01L 2224/1601* (2013.01); *H01L 2224/16238* (2013.01); *H01L 2224/1701* (2013.01); *H01L 2224/81193* (2013.01); *H01L 2224/81815* (2013.01); *H01L 2924/384* (2013.01); *H01L 2924/3841* (2013.01)

(58) Field of Classification Search
CPC .. H01L 24/14; H01L 24/09; H01L 2224/1701
USPC ......................................................... 257/737
See application file for complete search history.

(56) References Cited

U.S. PATENT DOCUMENTS

| | | | |
|---|---|---|---|
| 5,558,271 | A | 9/1996 | Rostoker et al. |
| 5,926,731 | A | 7/1999 | Coapman et al. |
| 6,392,163 | B1 | 5/2002 | Rinne et al. |
| 7,875,495 | B2 | 1/2011 | Kang et al. |
| 2005/0127508 | A1 | 6/2005 | Lee et al. |
| 2011/0248398 | A1 | 10/2011 | Parvarandeh et al. |
| 2016/0148877 | A1* | 5/2016 | Kitnarong ........... H01L 21/4839 257/666 |
| 2016/0211197 | A9* | 7/2016 | Groenhuis ............... H01L 24/83 |
| 2016/0276251 | A1* | 9/2016 | Mustanir ........... H01L 23/49541 |
| 2017/0294367 | A1* | 10/2017 | Kitnarong ........... H01L 21/4835 |
| 2018/0033647 | A1* | 2/2018 | Bin Mohd Arshad ...................... H01L 23/49548 |

* cited by examiner

*Primary Examiner* — Fernando L Toledo
*Assistant Examiner* — Adam S Bowen
(74) *Attorney, Agent, or Firm* — Ohlandt, Greeley, Ruggiero & Perle, L.L.P.

(57) ABSTRACT

A leadless package semiconductor device has a top surface, a bottom surface opposite to the top surface, and multiple sidewalls between the top and bottom surfaces. At least one connection pad is disposed on the bottom surface. The connection pad includes a connection portion and at least one protrusion portion that extends from the connection portion and away from the bottom surface such that the protrusion portion and the connection portion surround a space on the bottom surface.

17 Claims, 6 Drawing Sheets

LEADLESS PACKAGE WITH NON-COLLAPSIBLE BUMP

BACKGROUND

The present invention generally relates to leadless packages for semiconductor devices, and more particularly to a bump design that eliminates solder creeping to the sidewalls of a device.

Leadless semiconductor device packages are gaining in popularity. Leadless packages do not have pins that extend outside the body of the device, thereby reducing the overall size of the semiconductor device. Instead, leadless devices typically connect externally through soldering pads or balls on one of their surfaces, which improves electric and thermal performance at the solder joint where the device is attached to a printed circuit board (PCB).

Leadless packages are especially useful in Wafer Level Chip Scale Packaging (WLCSP). Typically a WLCSP has external connection-like pads or solder balls formed on one of its surfaces before singulation. The resulting packaged device has a size not much larger than the semiconductor die itself. Semiconductor devices are placed in alignment with soldering pads of external circuits that already have solder printed thereon, and then reflowed to melt the solder to electrically and mechanically attach the devices to the external circuits. For WLCSP devices, when its bottom surface is placed facing the PCB, solder will creep to the sidewalls, which typically comprise silicon without any shielding. This creeped solder acts as electrical connections, such that the extension to the silicon sidewalls of the WLCSP device inevitably impacts the device itself, e.g., causing interference, leakage, etc. An additional protective mold layer on the sidewall may be included to prevent the leakage, but adding a protective mold layer requires additional processes and higher cost.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, the present invention is a leadless packaged semiconductor device including a top surface, a bottom surface opposite to the top surface, and multiple sidewalls between the top surface and the bottom surface. There is at least one connection pad disposed on the bottom surface. The connection pad includes a connection portion and at least one protrusion portion that protrudes from and extends away from the connection portion and the bottom surface such that the protrusion portion and the connection surround a space on the bottom surface.

The protrusion portion is able to stand in contact with soldering pads of external circuits and forms spaces for receiving melted solder and attracting the melted solders to gather in corners of the protrusion portions and the connection portions, thereby suspending the corner of the semiconductor device at the bottom surface and the sidewall.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. The drawings are for facilitating an understanding of the invention and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
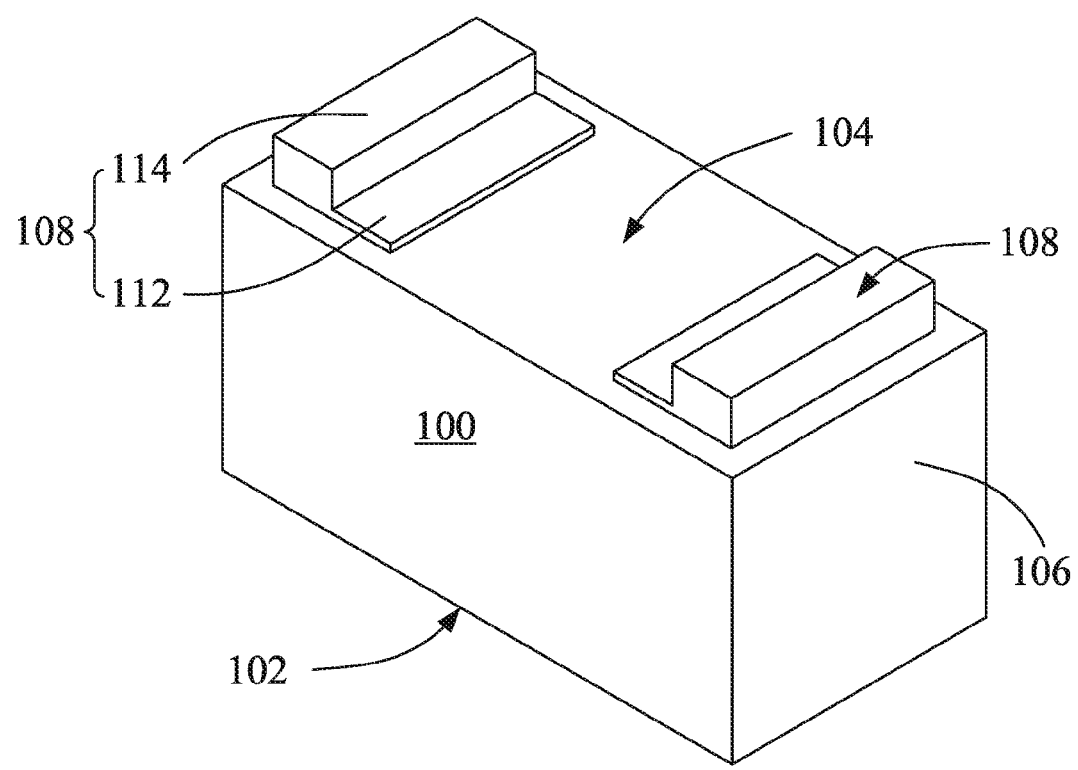
FIG. 1 is a perspective view of a semiconductor device according to a first embodiment of the present invention.
Figure 2:
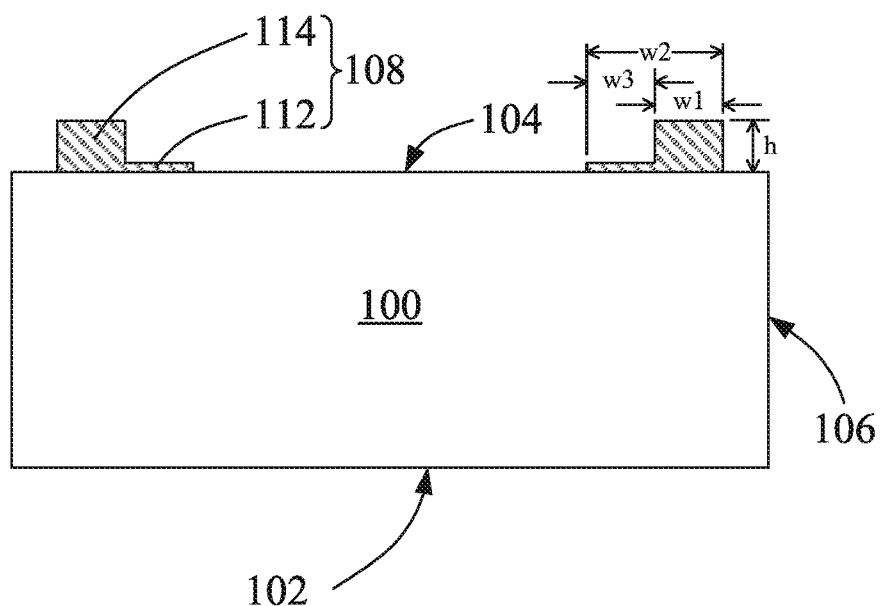
FIG. 2 is a side elevational view of the semiconductor device of FIG. 1.
Figure 3:
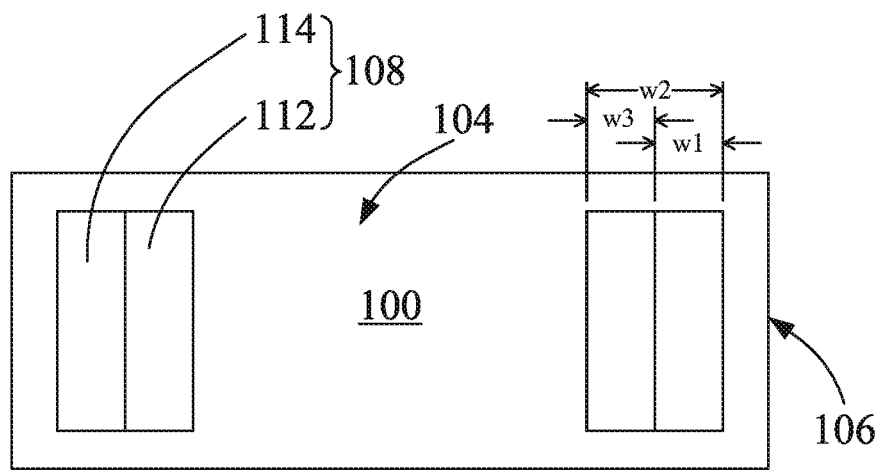
FIG. 3 is a bottom plan view of the semiconductor device of FIG. 1.

Referring now to FIGS. 1 to 3, a semiconductor device 100 according to a first embodiment of the present invention is illustrated. The semiconductor device 100 has a top surface 102, a bottom surface 104, and multiple sidewalls 106 disposed between the top and bottom surfaces 102 and 104. According to the present embodiment, the semiconductor device 100 is a 2-terminal device, such as a Schottky diode. The semiconductor device 100 includes two connection pads 108 formed on the bottom surface 104.

Each of the connection pads 108 has a stepped design, where each connection pad 108 includes a connection portion 112 and a step or protrusion portion 114. The connection portion 112 functions as the terminal of the semiconductor device 100, and is electrically connected to the internal circuitry (i.e., the Schottky diode) of the device. For WLCSP devices, the connection pads are printed or deposited onto the wafer during wafer fabrication processes before singulation. Accordingly, the connection portion 112 can be a plate that is coplanar with the bottom surface 104. It should be understood that the drawings are not necessarily to scale, with some features being exaggerated in order to more readily illustrate the invention. The connection portion 112 can be either coplanar or slightly protruding from the bottom surface 104, or even recessed in the bottom surface 104.

The step or protrusion portion 114 extends outwardly from the connection portion 112 and perpendicular to the bottom surface 104 of the semiconductor device 100. Taking the bottom surface 104 of the semiconductor device 100 as the reference, an outer top surface of the protrusion portion 114 is higher than or further away from the connection portion 112, and is formed on only a portion of the connection portion 112. In this first embodiment, the protrusion portion 114 covers about half of the outer surface of the connection portion. Also in this embodiment, the protrusion portion 112 covers a part of the connection portion 112 that is closer to a side wall 106 of the device 100.

Referring to FIGS. 2 and 3, the connection portion 112 can be formed on the bottom surface 104 and spaced from the sidewall 106. A width w1 of the protrusion portion 114 can be of any practical ratio with respect to a width w2 of the connection portion 112, subject to a maximum remaining width w3 of the connection portion 112 in consideration of a space required for adjacent conductive elements of the external circuit corresponding to the connection portion 112 to be apart from each other. Preferably, the width w1 of the protrusion portion 114 is about 50 µm, and the remaining width w3 of the connection portion 112 is about 80 µm (such that w2=130 µm). A height h of the protrusion portion 114 can be adjusted to provide an adequate space for receiving solder used to join the connection portion 112 with external circuits. In one embodiment, the height h is from about 50 µm to about 100 µm.

Figure 4:
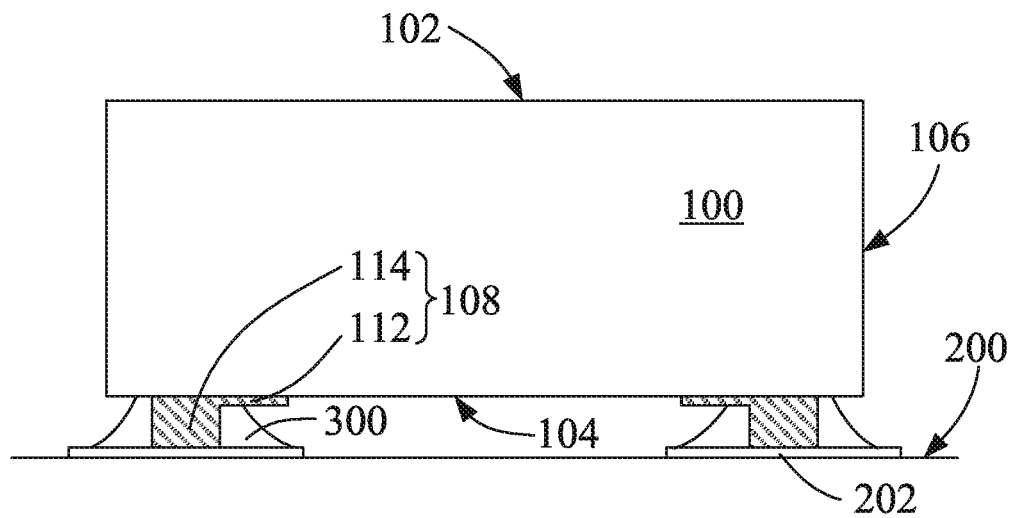
FIG. 4 is a side view of the semiconductor device of FIG. 1 connected to an external circuit.

FIG. 4 shows the device 100 being attached and electrically connected to an external circuit 200. The external circuit 200 may comprises another packaged semiconductor device or a printed circuit board, as is known in the art. The semiconductor device 100 is placed on the external circuit 200, with the connection pads 108 being aligned with solder pads 202 of the external circuit 200. The solder pads 202 typically have solder 300 printed or disposed thereon before the semiconductor device 100 is arranged on the external circuit 200. The bottom surface 104 of the semiconductor device 100 faces the external circuit 200 with the step or protrusion portion 114 contacting the solder pads 202. Accordingly, the connection portion 112 of the connection pad 108 is "floating" above the solder pad 202 by a distance of height h of the protrusion portion 114.

After placement of the semiconductor device 100 on the external circuit 200, a reflow process is performed to melt the solder 300, thereby electrically and mechanically connecting the connection portion 112 to the solder pad 202. Melted solder will gather together due to surface tension. In the absence of the protrusion portion 114, melted solder 300 will creep to and along the sidewalls 106. According to the present invention, the protrusion portion 114 acts as a dam to prevent the solder 300 from extending beyond the connection pad 108 and to the sidewalls 106.

Area Aperture Ration (AAR) is a significant indicator in dispensing solder. AAR is typically defined as the ratio of the area of aperture opening to the area of the sidewall of the aperture. Normally, dispensing or printing of the solder becomes more difficult as AAR decreases, and manufacturing cost increases. In applications where large AAR apparatuses are used to save cost and improve manufacturability, the area of the dispensed solder can be large enough such that, after the semiconductor device 100 is placed, solder is located outside the profile of the connection pad 108, as shown in FIG. 4.

FIG. 4 illustrates that because the connection pads 108 are slightly spaced from the sidewalls 106, after reflow, the solder wicks up the protrusion portion 114 and to the bottom surface 104 of the device 100, but does not creep up the sidewalls 106.

Referring to FIG. 3, in the present embodiment, the semiconductor device 100 has two connection pads 108 that are disposed symmetrically on the bottom surface 104. The semiconductor device 100 can have two parallel strip-shaped protrusion portions 114 that stand on corresponding soldering pads 202 as "feet". The semiconductor device 100 is able to be firmly supported and does not tilt, as devices without such feet may be apt to do.

Figure 5:
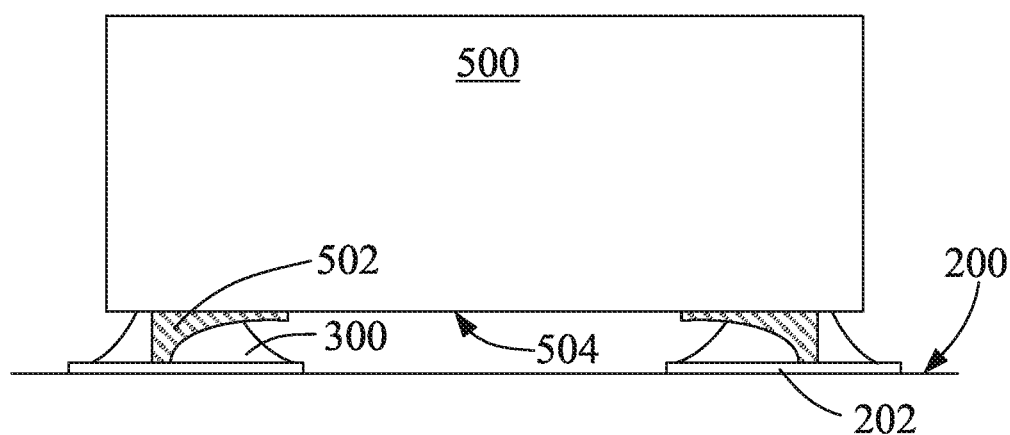
FIG. 5 is a side view of a semiconductor device, according to a second embodiment of the present invention, connected to an external circuit.

FIG. 5 shows a semiconductor device 500 in accordance with a second embodiment of the present invention. The semiconductor device 500 is connected to an external circuit 200. The semiconductor device 500 is similar to the semiconductor device 100 of the first embodiment. The semiconductor device 500 includes at least two connection pads 502 on its bottom surface 504. The connection pads 502 have a first side that is near an edge of the bottom surface 504 and a second side that is near a central part of the bottom surface 504. In this embodiment, the first side includes a protrusion such that the first side is spaced further from the bottom surface 504 than the second side. However, as opposed to the first embodiment in which the connection pad is stepped, in this embodiment the connection pad 502 has a sloped or arced profile from the first side to the second side. Like the first embodiment, when attached to the external circuit 200, the arced or sloped connection pad 502 covers a space used for receiving melted solder, which prevents the solder from flowing and creeping onto the sidewall of the semiconductor device 500.

Figure 6:
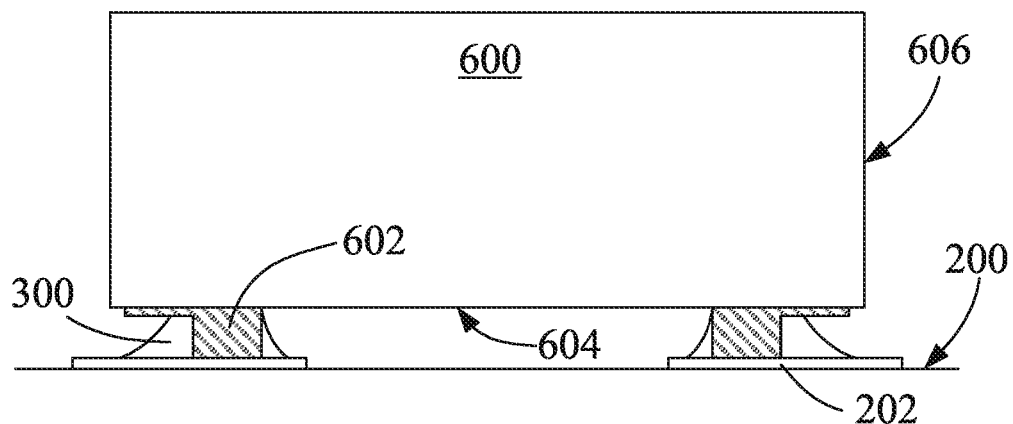
FIG. 6 is a side view of a semiconductor device, according to a third embodiment of the present invention, connected to an external circuit.

FIG. 6 illustrates a semiconductor device 600 in accordance with a third embodiment of the present invention. The device 600 is connected to an external circuit 200. The semiconductor device 600 has stepped connection pads 602 on its bottom surface 604, which are like the connection pads 108 (FIG. 1) except that the protrusion portion in this third embodiment is closer to the center region of the bottom surface 604 than to the sidewalls 606. That is, each of the connection pads 602 has a protrusion portion that extends from the connection portion, and the protrusion portion has a height that is greater than a height of the connection portion with respect to the bottom surface 604. The connection pads 602 are thus configured to be "L" shaped. As shown in FIG. 6, in connection with the external circuit 200, the protrusion portions contact the corresponding soldering pads 202, and support the semiconductor device 600 and the connection pads 602 define a space for receiving melted solder 300 therein. Since a corner of the semiconductor device 600 at the bottom surface 604 and the sidewall 606 is suspended, and because melted solder typically aggregates to the corner of the wetted protrusion portion and connection portion of the connection pad, it is less likely that the melted solder will creep to the sidewall 606.

It will be appreciated that the connection pads 502 of the second embodiment can be alternatively configured such that a side near the central portion of the bottom surface 504 protrudes and is higher than the side near the edge portion of the bottom surface 504.

Figure 7:
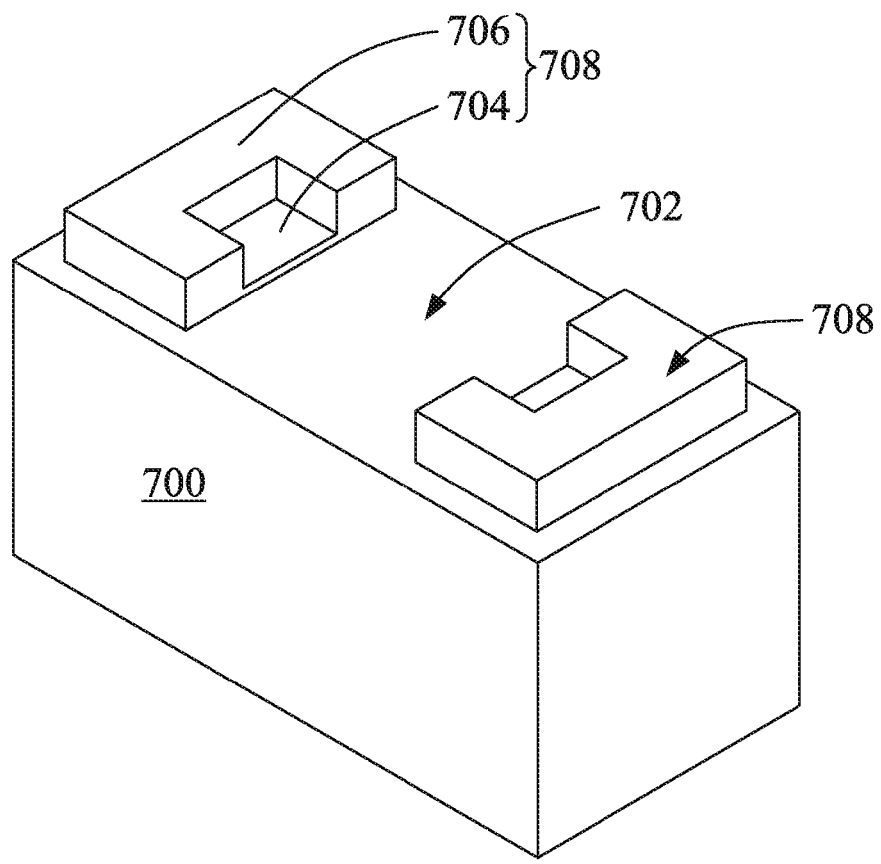
FIG. 7 is a perspective view of a semiconductor device according to a fourth embodiment of the present invention.

FIG. 7 shows a perspective view of a semiconductor device 700 according to a fourth embodiment of the present invention. The semiconductor device 700 has a bottom surface 702 on which at least one connection pad 708 is placed. The connection pad 708 includes a connection portion 704 that is reasonably flush or coplanar with the bottom surface 702, and multiple protrusion portions 706 that protrude from the connection portion 704. The multiple protrusion portions 706 are shown as being disposed along edges of the connection portion 704 and extend perpendicularly from the connection portion 704. Neighboring protrusion portions 706 abut each other such that the protrusion portions form a generally U-shape over the connection portion 704.

Figure 8:
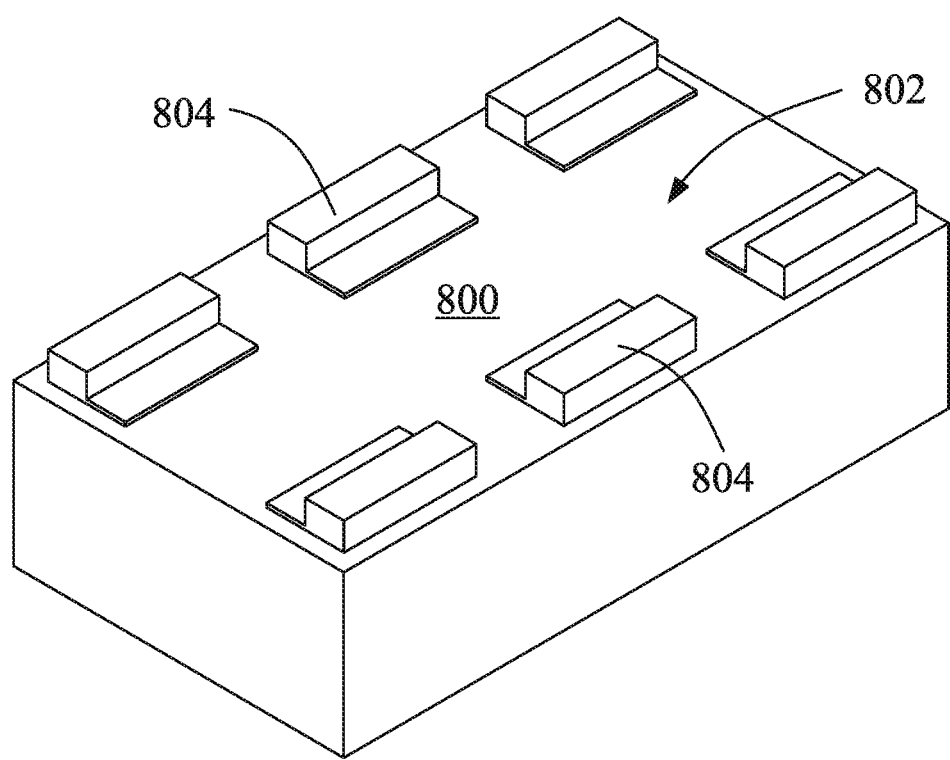
FIG. 8 is a perspective view of a semiconductor device according to a fifth embodiment of the present invention.

FIG. 8 shows a semiconductor device 800 in accordance with a fifth embodiment where the device 800 includes a plurality of connection pads 804 on a bottom surface 802. In this embodiment, there are six (6) connection pads spaced in two rows of three (3) along opposite sides of the bottom surface 802. The connection pads 804 are sized and shaped like the connection pads 108 of the first embodiment (FIGS. 1-3).

Figure 9:
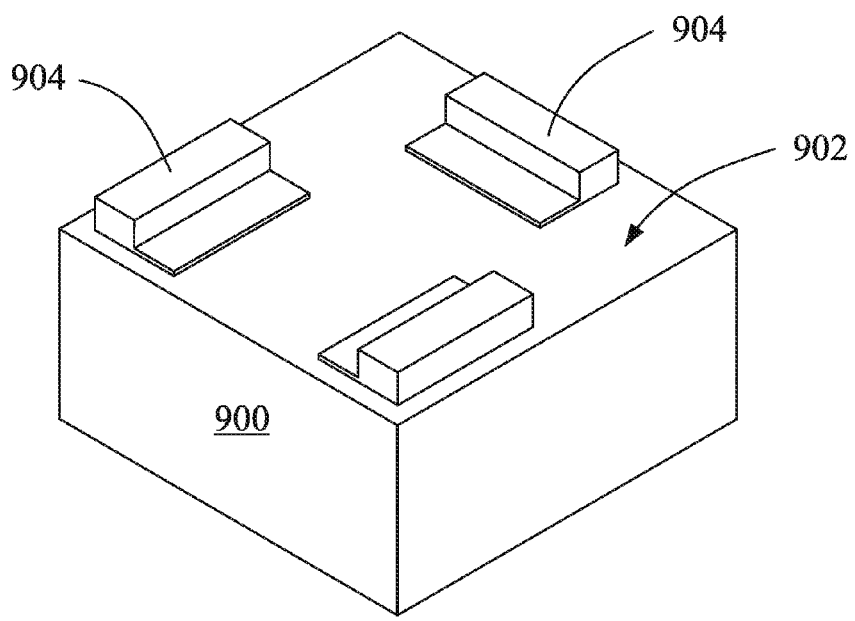
FIG. 9 is a perspective view of a semiconductor device according to a sixth embodiment of the present invention.

The number of connection pads of the semiconductor device can be modified. A sixth embodiment, shown in FIG. 9, illustrates a device 900 having a bottom surface 902 with three (3) connection pads 904, where the connection pads are sized and shaped like the connection pads 108 of the first embodiment. In this sixth embodiment, the pads are arranged along three (3) edges of the bottom surface 902, with one pad 904 located at a center of such edge and the other two located on edges adjacent to that on which the first pad is located but opposing each other. It will be appreciated that the present invention encompasses other configurations too.

Figure 10:
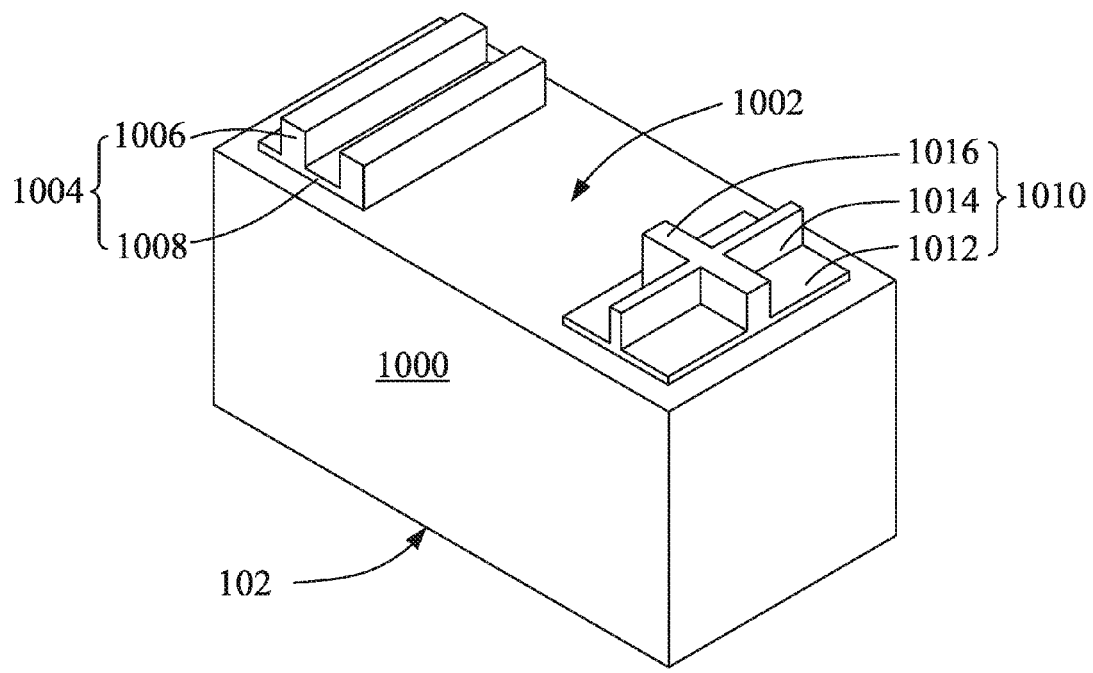
FIG. 10 is a perspective view of a semiconductor device including various connection pads in accordance with other embodiments of the present invention.

FIG. 10 shows a semiconductor device 1000 in accordance with a seventh embodiment of the present invention. The device 1000 has a bottom surface 1002 on which a first connection pad 1004 and a second connection pad 1010 are placed. The first connection pad 1004 includes a connection portion 1008 and multiple protrusion portions 1006 that extend from the connection portion 1008, parallel with each other and perpendicular to the bottom surface 1002. The second connection pad 1010 includes a connection portion 1012 and multiple protrusion portions 1014 and 1016 that extend from the connection portion 1012, and perpendicular with respect to each other such that the protrusion portions 1014 and 1016 intersect. It is noted that different kinds of connection pads as described in the present seventh embodiment, as well as other described embodiments, can be included simultaneously in one semiconductor device, as opposed to including only one kind in a semiconductor device. The number of connection pads is determined according to the semiconductor device itself considering its external connection requirements.

In connection with external circuits, the protrusion portions will stand in contact with the soldering pads of the external circuits, and define spaces for receiving melted solder and attracting the melted solder to gather in the corner between the protrusion portions and the connection portions.

It will be understood that the protrusion portions of the embodiments can be made of the same material as the connection portions. In WLCSP processes, the connection pads of the semiconductor device are usually manufactured in wafer fabrications. The connection pads can be shaped through depositing and etching, or printing, etc.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A leadless semiconductor device, comprising:
a top surface, a bottom surface opposite to the top surface, and multiple sidewalls extending between the top surface and the bottom surface; and
at least one connection pad formed on the bottom surface, wherein the connection pad comprises a connection portion and at least one protrusion portion that protrudes outwardly from the connection portion and perpendicular to the bottom surface of the semiconductor device so that an outer surface of the protrusion portion opposite the bottom surface of the semiconductor device is further away from the bottom surface than the connection portion, and
wherein the at least one protrusion portion and the connection portion form a space on the bottom surface for receiving solder.

2. The semiconductor device of claim 1, wherein the at least one protrusion portion extends from a side of the connection portion to a predetermined height.

3. The semiconductor device of claim 1, wherein the connection pad comprises multiple protrusion portions that protrude from the connection portion.

4. The semiconductor device of claim 3, wherein the multiple protrusion portions are parallel with each other.

5. The semiconductor device of claim 3, wherein at least one of the multiple protrusion portions intersects with at least another one of the multiple protrusion portions.

6. The semiconductor device of claim 3, wherein one of the multiple protrusion portions is perpendicular to another one of the multiple protrusion portions such that said protrusion portions intersect.

7. The semiconductor device of claim 1, wherein the at least one protrusion portion protrudes perpendicularly from the connection portion such that the connection pad is "L" shaped.

8. The semiconductor device of claim 1, wherein the interface of the at least one protrusion portion and the connection portion has a sloped or arced profile.

9. The semiconductor device of claim 1, wherein the connection portion of the connection pad is disposed on the bottom surface and an edge of the connection portion is spaced by a predetermined distance from the sidewall.

10. The semiconductor device of claim 1, wherein the at least one protrusion portion protrudes from a side of the connection portion that is nearer a central position of the bottom surface than to an edge of the bottom surface.

11. The semiconductor device of claim 1, wherein the at least one protrusion portion protrudes from a side of the connection portion that is nearer to an edge position of the bottom surface that to a central position of the bottom surface.

12. The semiconductor device of claim 1, wherein connection portion of the connection pad is in facing arrangement with an external circuit when the semiconductor device is connected to the external circuit.

13. The semiconductor device of claim 1, wherein the at least one protrusion portion supports the semiconductor device when the device is connected to an external circuit.

14. The semiconductor device of claim 1, wherein the at least one protrusion portion contacts and is in electrical connection to a soldering pad of an external circuit when the semiconductor device is attached to the external circuit.

15. The semiconductor device of claim 1, wherein the connection pad is disposed on the bottom surface using a wafer fabrication process.

16. The semiconductor device of claim 1, wherein the at least one protrusion portion and the connection portion are made of the same material.

17. The semiconductor device of claim 1, wherein the connection pad is configured to provide an external connection for the semiconductor device.

* * * * *